United States Patent [19]

Aoki

[11] Patent Number: 4,839,897
[45] Date of Patent: Jun. 13, 1989

[54] FAULT DETECTING SYSTEM FOR ADPCM CODEC

[75] Inventor: Yasushi Aoki, Tokyo, Japan

[73] Assignee: NEC Corporation, Japan

[21] Appl. No.: 114,302

[22] Filed: Oct. 28, 1987

[30] Foreign Application Priority Data

Oct. 29, 1986 [JP] Japan ................................ 61-258902

[51] Int. Cl.⁴ ............................................... G06F 11/00
[52] U.S. Cl. ........................................ 371/68; 341/51; 341/76; 341/94
[58] Field of Search ............. 371/67, 68; 340/347 DD

[56] References Cited

U.S. PATENT DOCUMENTS

| | | | |
|---|---|---|---|
| 4,020,460 | 4/1977 | Jones et al. ............................ | 371/68 |
| 4,081,790 | 3/1978 | Yamamoto et al. ................... | 371/68 |
| 4,176,258 | 11/1979 | Jackson ................................ | 371/68 |
| 4,328,584 | 5/1982 | Samuelsson et al. ................. | 371/68 |

Primary Examiner—Charles E. Atkinson
Attorney, Agent, or Firm—Laff, Whitesel, Conte & Saret

[57] ABSTRACT

A fault detecting system is provided for detecting fault of an ADPCM codec for transcoding an input signal between an ADPCM and a PCM to produce a first code converted signal. The ADPCM codec has a data RAM for storing data used for the transcoding and is provided with a data transmitter for transmitting the data. A fault detecting processor receives the data and generates a second code conversion signal from the received data. The fault detecting processor compares the first and the second code converted signals and produces a fault signal when both of the signals are not coincident with each other. The input signal can be supplied to the fault detecting processor directly or as a part of the data transmitted thereto. The fault detecting processor can detect fault of a plurality of ADPCM codecs by a time division fashion. The ADPCM codec and the fault detecting processor may be implemented as similar LSI processors each comprising a transcoding section, a data transmitting/receiving section, and a comparing section.

8 Claims, 5 Drawing Sheets

FAULT DETECTING SYSTEM FOR ADPCM CODEC

Background of the Invention

(1) Field of the Invention

The present invention relates to ADPCM (Adaptive Differential Pulse Code Modulation) codec (encoder and decoder), and in particular, to fault detection of the codec.

(2) Description of the Prior Art

As one of prediction coding, an ADPCM coding is known in the prior art which can provide a digital signal with an improved high quality by use of adaptive quantization and adaptive prediction.

The ADPCM signal is generated by performing a PCM to ADPCM code conversion, while the PCM signal is reproduced by carrying out an ADPCM-to-PCM code conversion. An algorithm of the PCM to/-from ADPCM code conversion is called ADPCM transcoding algorithm.

The CCITT (Comité Consultatif International Télégraphique et Téléphonique) published a precise specification for the ADPCM transcoding algorithm in Recommendation G.721 entitled "32 kbit/s Adaptive Differential Pulse Code Modulation (ADPCM)" in CCITT, Red Book III, October 1984 (Reference 1).

In a digital communication system using the ADPCM signal, an ADPCM encoder and an ADPCM decoder are necessary in a transmitter and a receiver side in the system, respectively. The ADPCM encoder carries out a PCM-to ADPCM code conversion, and the ADPCM decoder carries out the ADPCM-to-PCM code conversion.

Reference 1 also shows block diagrams of the ADPCM encoder and decoder.

An ADPCM LSI codec which can be used as an ADPCM encoder in a transmitter side and also used as an ADPCM decoder in a receiver side was proposed by Nishitani et al in a paper entitles "A CCITT Standard 32KBIT/s ADPCM LSI Codec" in IEEE TRANSACTIONS ON ACOUSTICS, SPEECH AND SIGNAL PROCESSING, Vol. ASSP-35, No. 2, February 1987 (Reference 2).

The ADPCM LSI codec is a software controllable LSI processor and is useful to reduce hardward amount of the encoder and the decoder and power dissipation.

Generally, an LSI processor is sometimes required to be subjected to a test for detecting any fault occurring in the processor. When such a fault test is performed on the ADPCM codec, the communication system using the ADPCM codec must be stopped and any communication cannot be achieved undesirably.

SUMMARY OF THE INVENTION

It is an object of the present invention to provide a fault detecting system for detecting occurrence of fault in an LSI codec without stopping operation of the communication system using the LSI codec so as to perform the fault detecting test.

It is another object of the present invention to provide an LSI processor which can be selectively used for an ADPCM codec in a communication system and for a detector detecting fault of the ADPCM codec during operation in the communication system.

According to the present invention, a fault detecting system for an ADPCM codec processor can be obtained. The ADPCM codec comprises a first signal input means for receiving an input signal, means for performing code conversion of the input signal between an ADPCM and a PCM to produce a first code converted signal, first random access storage means for storing data used for the code conversion, and a signal output means for sending out the first code converted signal. The fault detecting system comprises the ADPCM codec further comprising data transmitting means for transmitting the data stored in the random access storage means, and fault detecting processor means.

The fault detecting processor means comprises data receiving means being coupled with the data transmitting means for receiving the data; second random access storage means coupled with the data receiving means for storing the data received through the data receiving means; means for generating a second code converted signal based on the data stored in the second random access storage means; second signal input means being coupled with the signal output means for receiving the first code converted signal; and comparing means being coupled with the second signal input means and the generating means for comparing the first and the second code converted signals, the comparing means producing a fault signal representative of fault of the ADPCM codec when the first and the second code converted signals do not coincide with each other.

The fault detector can monitor and detect fault of a plurality of ADPCM codecs used in a multichannel communication system by use of a time division fashion.

According to the present invention, an LSI processor for use as said ADPCM codec and/or said fault detecting processor in the fault detecting system can be obtained which comprises a signal input means for receiving an input signal, a signal output means for sending out a code converted signal, means for producing the code converted signal by code conversion between an ADPCM and a PCM. The producing means has random access storage means for storing data used for the code conversion, data transmitting and/or receiving means coupled with the random access storage means, and comparing means coupled with the producing means and operatively coupled with the signal input means for comparing the code converted signal from the producing means and a signal incoming through the signal input means when operatively coupled, the comparing means producing a fault signal when the converted signal and the incoming signal do not coincident with each other.

DESCRIPTION OF PREFERRED EMBODIMENTS

Figure 1:
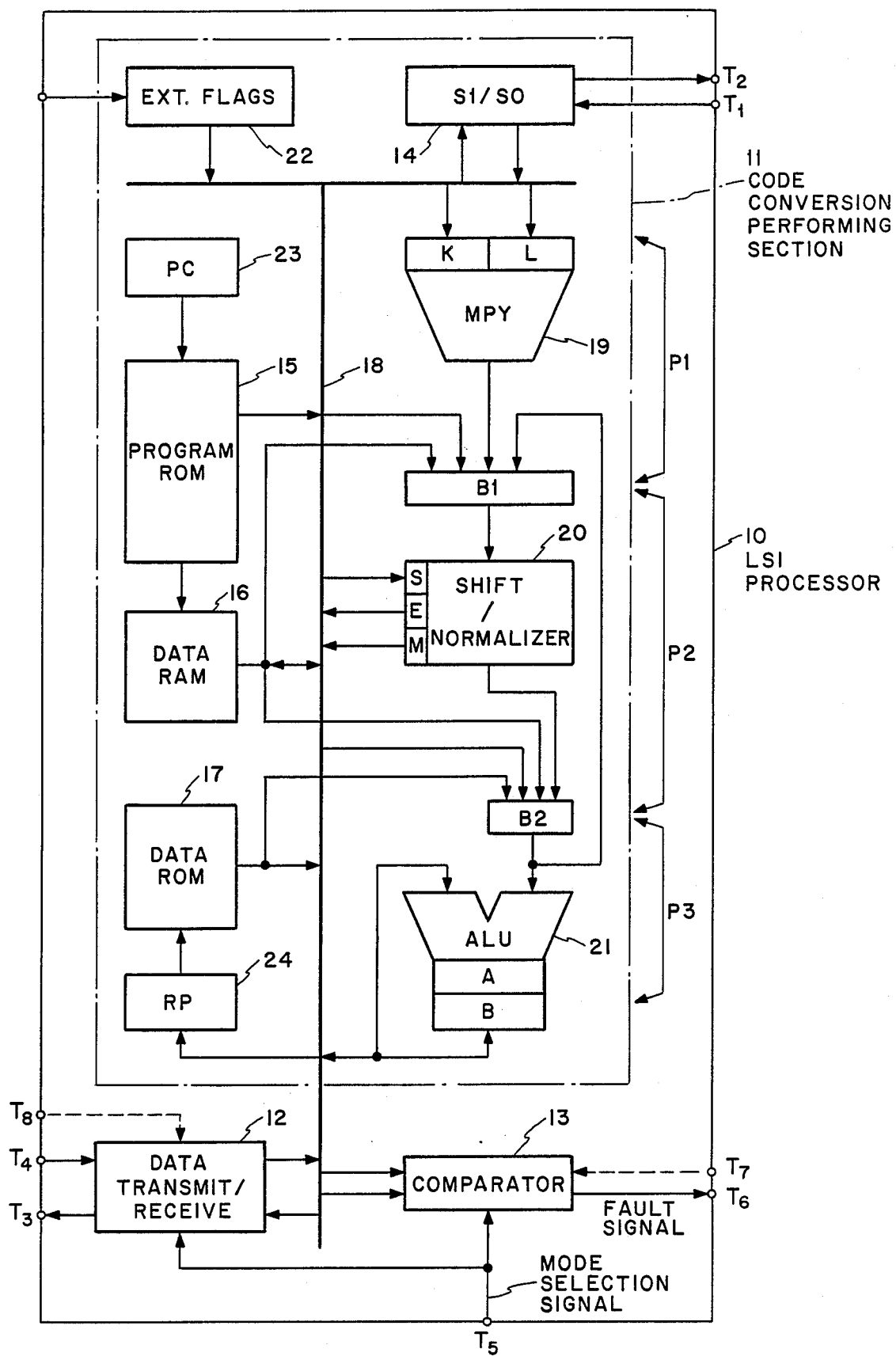
FIG. 1 is a block diagram view for schematically illustrating an LSI processor capable of being used for an ADPCM codec and also for a fault detecting processor for detecting fault occurrence in the ADPCM codec.

Referring to FIG. 1, an LSI processor 10 is shown which is used as an ADPCM codec and/or a fault detecting processor according to an embodiment of the present invention. The LSI processor 10 comprises a code conversion performing section 11, a data transmit/receive circuit 12, and a comparator 13.

The code conversion performing section 11 is implemented similar to the ADPCM processor shown in Reference 2 as described in the preamble. That is, the code conversion performing section 11 comprises serial input/serial output ports 14 for receiving an input signal incoming through a signal input terminal $T_1$ and for sending out a processed signal through a signal output terminal $T_2$, respectively. The code conversion performing section 11 further comprises a program ROM (Read Only Memory) 15 for storing a program used for controlling execution of code conversion of the incoming signal, a data RAM (Random Access Memory) 16 for storing variable data, such as predictor coefficients, speed control parameters, and others (In detail, A1*, A2*, AP*, B1*, . . . ,B6*, DML*, DMS*, DQ1*, . . . ,DQ6*, PK1*, PK2*, SR1*, SR2*, YL*, YU* shown in TABLE 3/G.721 in Reference 1 described in the preamble) used for performing the code conversion, and a data ROM 17 for storing fixed data, such as quantizer threshold values, lookup table contents, and mask patterns for truncating processed data to specific bit-lengths.

The program ROM 15, the data RAM 16, and the data ROM 17 are connected to the serial input/serial output ports 14 and an execution circuit through a data bus 18.

The execution circuit comprises a multiplier (MPY) 19, a shift/normalizer 20, an arithmetic logic unit (ALU) 21, and several registers K, L, B1, S, E, M, B2, A, and B. This executing circuit employs a programmable pipeline architecture, where the multiplier 19, the shift/normalizer 20, and the arithmetic logic unit 21 can be reconfigured as a three (P1-P2-P3) stage pipeline or a two (P2-P3) stage pipeline.

The input signal incoming through input terminal $T_1$ is code converted at the execution circuit under control by the program stored in the program ROM 15. The code converted signal is sent out through output terminal $T_2$. An external flags 22 indicate which the code conversion is a PCM-to ADPCM code conversion or a ADPCM-to-PCM code conversion.

The program ROM 15 and the data ROM 17 are associated with a program counter (PC) 23 and a ROM pointer (RP) 24, respectively.

Further detailed description to the code conversion performing section 11 is omitted in the description for the purpose of the simplification of the description and will be understood by use of Reference 2.

The data transmit/receive circuit 12 is for reading data in the data RAM 16 through the data bus 18 to transmit the read data through a terminal $T_3$ or for receiving data through a terminal $T_4$ to store the received data into the data RAM 16 through the data bus 18. A mode selection signal through a terminal $T_5$ indicates one of a transmitter and a receiver mode of the data transmit/receive circuit 12.

The program ROM 15 further stores a program for controlling operation of the data transmit/receiver circuit 12.

The comparator 13 is coupled with the serial input/output ports 14 and the executing circuit through the data bus 18. The comparator 13 is supplied with a signal incoming through the input terminal $T_1$ and with a signal processed at the executing circuit. The comparator 13 compares the supplied signals and produces a fault signal to deliver the fault signal through a terminal $T_6$ when both signals are not coincident with each other. The mode selection signal through the terminal $T_5$ also indicates whether or not the comparator 13 should carry out the comparing operation.

The program ROM 15 also stores another program to control application of the input signal incoming through the terminal $T_1$ and the processed signal into the comparator 13 and to enable the comparator 13 to carry out the comparing operation.

In a modification, the comparator 13 is designed to be supplied with a signal to be compared with the processed signal not through the serial input/serial output ports 14 but through a terminal $T_7$ directly.

The LSI processor 10 can have a control terminal $T_8$ for receiving a control signal which is for driving the data transmit/receive circuit 12.

Figure 2:
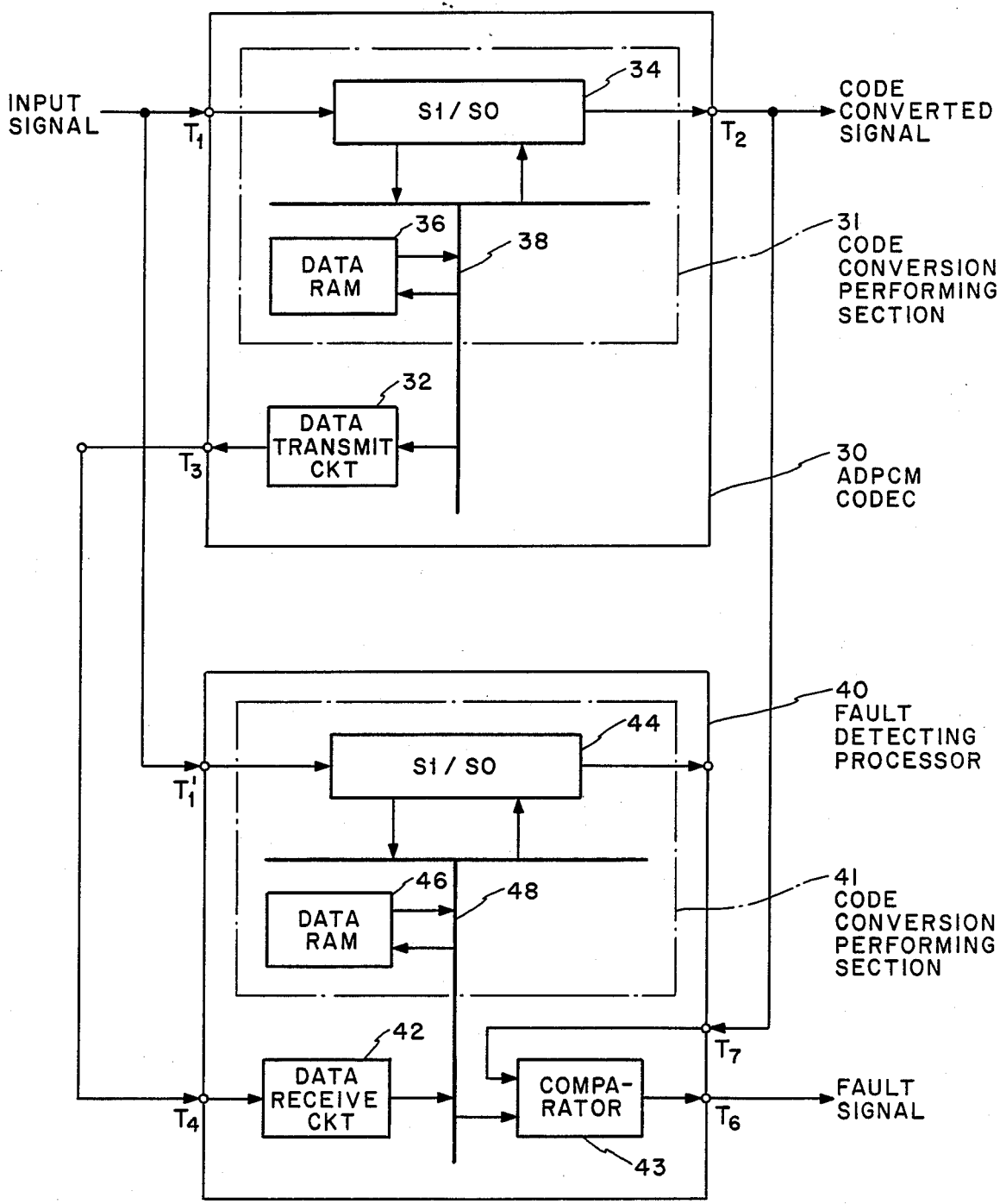
FIG. 2 is a block diagram view of a fault detecting system for detecting fault in an ADPCM codec according to an embodiment of the present invention.

Referring to FIG. 2, a fault detecting system according to one embodiment of the present invention comprises two LSI processors 30 and 40 which are similar to the processor 10 in FIG. 1.

The LSI processor 30 is used as an ADPCM codec for performing code conversion on an input signal incoming through the input terminal $T_1$ to send out the code converted signal through the terminal $T_2$. That is, the serial input/serial output ports 14, the code conversion performing section 11, data RAM 16, and data bus 18 in FIG. 1 are shown at 34, 31, 36 and 38, respectively. The other blocks in the code conversion performing section 11 in FIG. 1 are omitted in FIG. 2 for the purpose of the simplification.

The input signal is code converted at the code conversion performing section 31 in the similar manner as in the known ADPCM codec disclosed in Reference 2, and the code converted signal is sent out through terminal $T_2$.

The data transmit/receive circuit (12 in FIG. 1) is indicated as a data transmitter mode by the mode selection signal from the terminal $T_5$ (FIG. 1) and is shown as the data transmitter 32 in the figure. The data transmitter 32 sends out the data stored in the data RAM 36 through the terminal $T_3$.

The comparator (13 in FIG. 1) is indicated as an inoperative mode by the mode selection signal and is not shown in the ADPCM codec 30.

The other LSI processor 40 also comprises a code conversion performing section 41 for performing code conversion on the same input signal through an input terminal $T'_1$ similar to the code conversion performing section 31 in the ADPCM codec 30. That is, the code conversion performing section 41, the serial input/output ports 44, the data RAM 46 and the data bus 48 are corresponding to those shown at 11, 14, 16, and 18 in FIG. 1.

However, the LSI processor 40 is operative to detect fault of the processors 30 and 40. That is, the data transmit/receive circuit (12 in FIG. 1) is set in a data receiver mode and is shown as a data receiver circuit 42 for receiving the data sent out from the data transmitter circuit 32 of the ADPCM codec 30. Also, the comparator 13 is selected in the operative mode and is shown as a comparator 43 for comparing a signal processed in the code conversion performing section 41 and a signal incoming through the terminal $T_7$ which is a code converted signal from the ADPCM codec 30.

In operation, the input signal is processed and is code converted at the code conversion performing section 31 in the ADPCM codec 30. The code converted signal is sent out as a first code converted signal through terminal $T_2$. The data stored in the data RAM 36 is sent out by the data transmitter circuit 32 through the terminal $T_3$ to the terminal $T_4$ of the fault detecting processor 40.

The data receiver circuit 42 receives the data through the terminal $T_4$ and stores the data in the data RAM 46. The code conversion performing section 41 also processes the same input signal incoming through the terminal $T'_1$ to produce a second code converted signal. The second code converted signal is applied to the comparator 43.

The first code converted signal is also supplied to the comparator 43 through the terminal $T_7$ and is compared with the second code converted signal.

The first and second code converted signals are obtained by performing code conversion on the same signal by use of the similar data in data RAMs 36 and 46. Accordingly, the first and second code converted signals are coincident with each other when no fault occurs in both of the processors 30 and 40. But, when either one of the processors 30 and 40 is faulty, the first and second code converted signals are not coincident with each other. The comparator 43 produces a fault signal which is delivered through the terminal $T_6$, when the first and second code converted signals are not coincident with each other.

Thus, fault of the ADPCM codec 30 can be detected while the codec is actually used for code conversion of the incoming signal.

Figure 3:
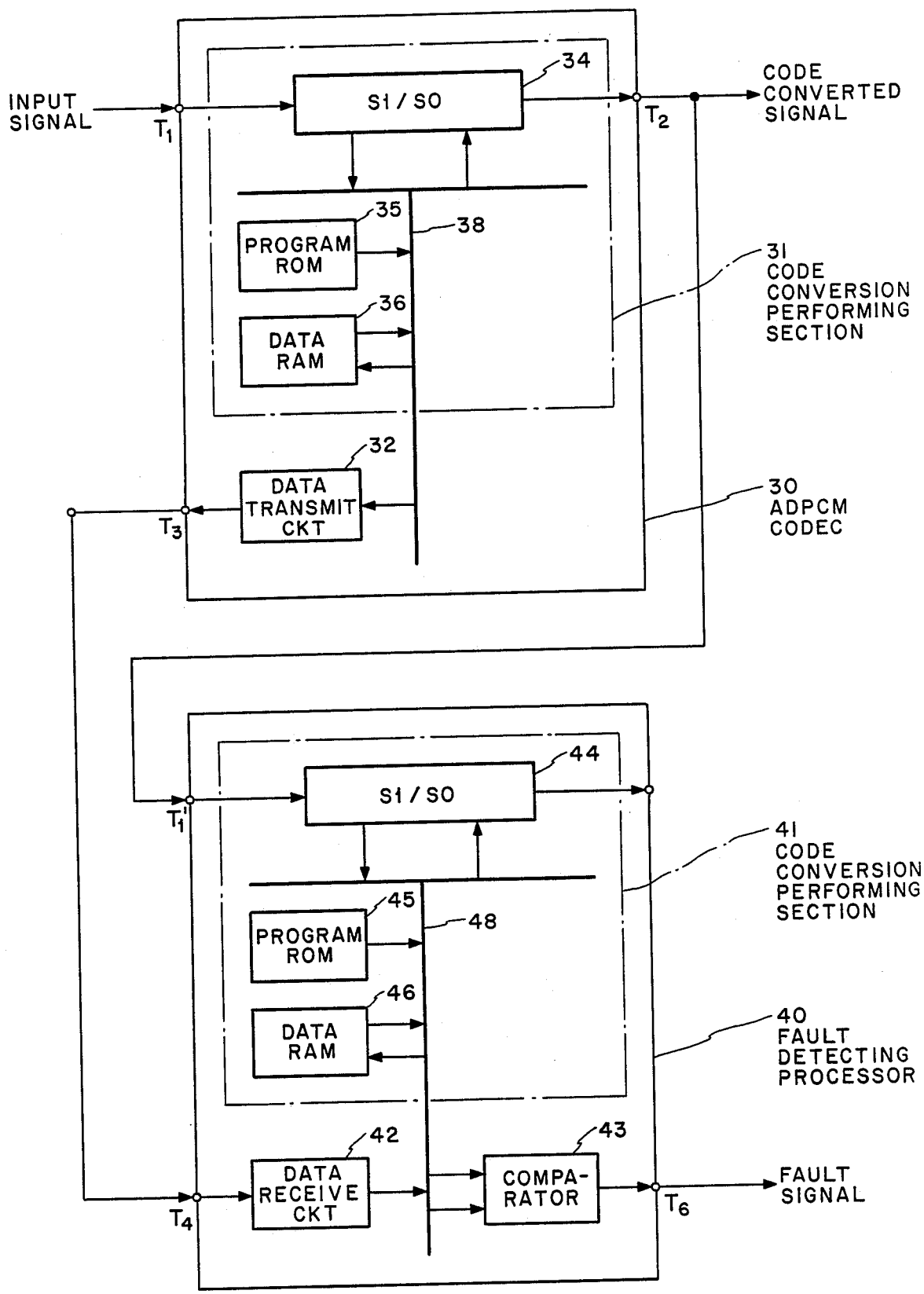
FIG. 3 is a block diagram view of another fault detecting system according to another embodiment of the present invention.

Referring to FIG. 3, another fault detecting system shown therein is similar to the system shown in FIG. 2 but is different in that the first code converted signal from the ADPCM codec 30 is supplied to the fault detecting processor 40 through not the terminal $T_7$ but the terminal $T'_1$. The similar blocks are shown with the same reference characters in FIG. 2 and detailed description thereto is omitted.

In the code conversion performing section 31 in the ADPCM codec 30, a program ROM 35 corresponding to the program ROM 15 in FIG. 1 includes a program for storing the input signal into the data RAM 36. Accordingly, the input signal is included in the data transmitted from the data transmitter circuit 32 to the fault detecting processor 40.

The fault detecting processor 40 receives the first code converted signal through the input terminal $T'_1$. Further, the input signal to be code converted is stored in the data RAM 46 through the data receiver circuit 42.

A program ROM 45 corresponding to the program ROM 15 in FIG. 1 includes a program for transferring a signal incoming through the input terminal $T'_1$ to the comparator 43 and for reading out the input signal to be code converted from the data RAM 46 to supply it the executing circuit (not shown) for processing the signal to produce a second code converted signal. The second code converted signal is applied to the comparator 43.

In this embodiment, the first and second code converted signals are also coincident with each other, if both of the processors 30 and 40 are not faulty. The comparator 43 produces a fault signal and delivers it through terminal $T_6$ when the first and second code converted signals are not coincident with each other.

Figure 4:
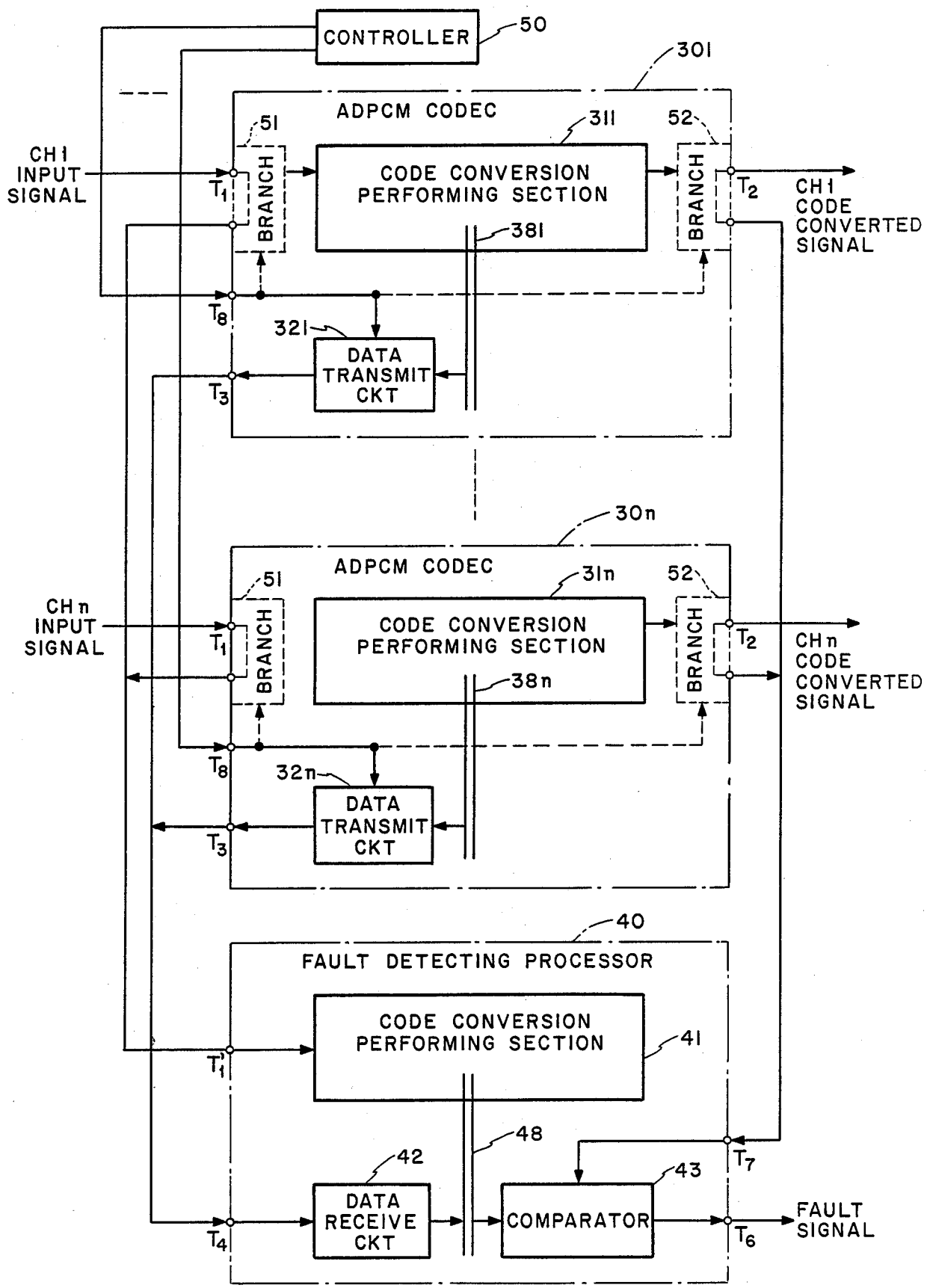
FIG. 4 is a block diagram view of a fault detecting system for detecting fault of multichannel ADPCM codecs according to another embodiment of the present invention.

Turning to FIG. 4, a fault detecting system is shown for detecting fault of each of ADPCM codecs in multichannel communication system. A plurality of ADPCM codecs 301 through 30n (n is an integer more than 1) are used for performing code conversion of n channel signals. Each ADPCM codec of 301 through 30n is similar to the codec 30 shown in FIG. 2 except that each codec of 301 through 30n is controlled by a controller 50. Therefore, blocks in each codec 301 through 30n are shown with the same reference characters associated with suffixes 1 through n.

A single fault detecting processor 40 is also similar to that in FIG. 2 and detects fault of each of n codecs 301-30n by a time sharing fashion under control of the controller 50.

The controller 50 repeatedly produces n control signals which are present one after another with a predetermined time interval between two succeeding ones. The n control signals are supplied to the terminals $T_8$ of n codecs 301 through 30n, respectively.

In each codec of 301 through 30n, the data transmitter circuit of 321 through 32n is driven by the control signal through the terminal $T_8$ to send out the data in the data RAM to the fault detecting processor 40.

In a usual multichannel communication system, the plurality of channel signals are present in the time division fashion. Therefore, the n control signals are synchronized with the n channel signals, so that the single fault detecting processor 40 can monitor the n codecs 301 through 30n one after another to detect fault of each codec of 301 through 30n.

When the n channel signals are present in not the time division fashion but in a time parallel fashion, signal branch circuits 51 and 52 are provided at the input terminal $T_1$ and the output terminal $T_2$ of each codec 301 through 30n, as shown by dotted lines in the figure. The signal branch circuits 51 and 52 are driven by the control signal to branch the input and output signals to the fault detecting processor 40.

Figure 5:
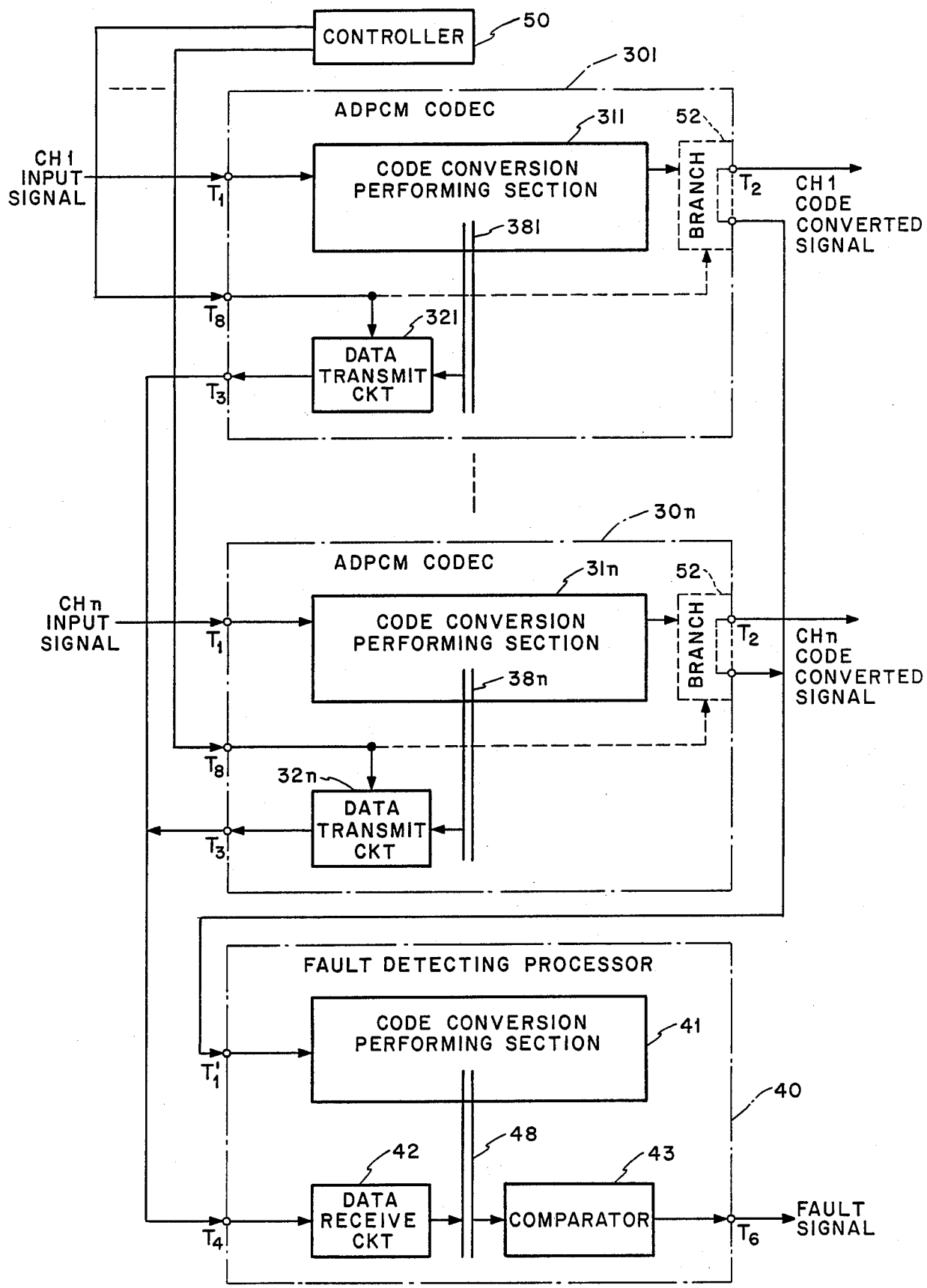
FIG. 5 is a block diagram view of another fault detecting system for detecting fault of multichannel ADPCM codecs according to another embodiment.

Referring to FIG. 5, another fault detecting system for a multichannel codec shown therein comprises a plurality of codecs 301 through 30n for n channel signals each of which is similar to the codec 30 in FIG. 3, and a single fault detecting processor 40 which is similar to the processor 40 in FIG. 3.

In this embodiment, a controller 50 similar to that in FIG. 4 is used for making the single fault detecting processor 40 detect fault of the n codecs 301 through 30n in the time sharing fashion. That is, the data transmitter circuit 321 through 32n in each codec of 301 through 30n is driven by the control signal from the controller 50 so that the fault detecting processor 40 can detect fault of each of n codecs 301 through 30n in the time sharing fashion.

When the n channel signals are present in not the time division fashion but in the time parallel fashion, the signal branch circuit 52 is also required to be provided at the output terminal $T_2$ of each codec and is driven by the control signal, as described in connection with the embodiment of FIG. 4. However, the other signal branch circuit (51 in FIG. 4) is not necessary because each channel signal is not delivered to the fault detecting processor 40 from the input terminal $T_1$.

What is claimed is:

1. A fault detecting system for an ADPCM codec comprising a first signal input means for receiving an input signal, means for performing code conversion of said input signal between an ADPCM and PCM to produce a first code converted signal, first random access storage means for storing data used for the code conversion, and a signal output means for sending out said first code converted signal, which comprises:

said ADPCM codec further comprising data transmitting means for transmitting said data stored in said random access storage means; and
fault detecting processor means;
said fault detecting processor means comprising:
data receiving means coupled with said data transmitting means for receiving said data;
second random access storage means coupled with said data receiving means for storing said data received through said data receiving means;
generating means for converting said input signal based on said data stored in said second random access storage means in order to generate a second code converted signal;
second signal input means being coupled with said signal output means for receiving said first code converted signal; and
comparing means being coupled with said second signal input means and said generating means for comparing said first and said second code converted signals, said comparing means producing a fault signal representative of fault of said ADPCM codec when said first and said second code converted signals do not coincide with each other.

2. A fault detecting system as claimed in claim 1, wherein said first random access storage means stores the input signal incoming through the first signal input means as a part of said data.

3. A fault detecting system as claimed in claim 1, wherein said fault detecting processor further comprises a third signal input means for receiving said input signal, said generating means being coupled with said third signal input means and supplied with said input signal from said third signal input means.

4. An LSI processor for use as both an ADPCM codec and a fault detecting processor associated with said ADPCM coded, which comprises:
a signal input means for receiving an input signal;
a signal output means for sending out a code converted signal;
means for producing the code converted signal by code conversion between an ADPCM and PCM, said producing means having random access storage means for storing data used for the code conversion;
data transmitting and/or receiving means coupled with said random access storage means; and
comparing means coupled with said producing means and operatively coupled with said signal input means for comparing the code converted signal from said producing means and a signal incoming through said signal input means when operatively coupled, said comparing means producing a fault signal when the converted signal and the incoming signal are not coincident with each other.

5. A fault detecting system for a multichannel ADPCM codec system comprising a plurality of ADPCM codecs for performing code conversions on incoming channel signals which are in a time division format, said code conversion being between ADPCM and PCM codes in order to send out code converted channel signals, respectively, each of said plurality of ADPCM codecs comprising first random access storage means for storing data used for the code conversion and an output terminal for sending out a corresponding one of said code converted channel signals, which comprises:

each of said plurality of ADPCM codecs comprising data transmitting means responsive to a control signal for transmitting said data stored in said first random access storage means;
control means for producing said control signal and distributing said control signal to said plurality of ADPCM codecs one after another at a predetermined time interval; and
a fault detector for detecting any fault in each of said plurality of ADPCM codecs;
said fault detector comprising:
data receiving means commonly coupled with said data transmitting means of each of said plurality of ADPCM codecs for receiving said data transmitted from said data transmitting means;
second random access storage means coupled with said data receiving means for storing said data received through said data receiving means;
generating means for converting each of said incoming channel signals based on said data stored in said second random access storage means in order to generate a code converted signal;
first signal input means commonly coupled with said output terminal of each of said plurality of ADPCM codecs for receiving said code converted channel signal from each of said plurality of ADPCM codecs; and
comparing means coupled with said signal input means and with said generating means for comparing said code converted channel signal and said code converted signals, said comparing means producing a fault signal representative of any fault of each of said plurality of ADPCM codecs when said code converted channel signal and said code converted signals do not coincide with each other.

6. A fault detecting system as claimed in claim 5, wherein said first random access storage means stores the incoming channel signal as a part of said data.

7. A fault detecting system as claimed in claim 5, wherein said fault detector further comprises second signal input means for receiving each of said incoming channel signals, said generating means being coupled with said second signal input means and supplied with each of said incoming channel signals from said second signal input means.

8. A fault detecting system for a multichannel ADPCM codec system comprising a plurality of ADPCM codecs for performing code conversions on incoming channel signals in order to send out code converted channel signals, said code conversions being between an ADPCM and a PCM, respectively, each of said plurality of ADPCM codecs comprising first random access storage means for storing data used for the code conversion and an output terminal for sending out a corresponding one of said code converted channel signals, which comprises:

each of said plurality of ADPCM codecs comprising signal branching means provided at said output terminal and responsive to a control signal for branching said code converted channel signal from said output terminal, and data transmitting means responsive to said control signal for transmitting said data stored in said first random access storage means;

control means for producing said control signal and distributing said control signal for said plurality of ADPCM codecs one after another at a predetermined time interval; and a fault detector for detecting fault of each of said plurality of ADPCM codecs;

said fault detector comprising;

data receiving means commonly coupled with said data transmitting means of each of said plurality of ADPCM codecs for receiving said data transmitted from said data transmitting means;

second random access storage means coupled with said data receiving means for storing said data received through said data receiving means;

generating means for converting each of said incoming channel signals based on said data stored in said second random access storage means in order to generate a code converted signal;

signal input means commonly coupled with said signal branching means of each of said plurality of ADPCM codecs for receiving said code converted channel signal branched from said branching means; and comparing means coupled with said signal input means and with said generating means for comparing said code converted channel signal and said code converted signals, said comparing means producing a fault signal which is representative of a fault of each of said plurality of ADPCM codecs when said code converted channel signal and said code converted signals do not coincide with each other.

* * * * *